United States Patent [19]

Chen et al.

[11] Patent Number: 5,894,145
[45] Date of Patent: Apr. 13, 1999

[54] MULTIPLE SUBSTRATE BIAS RANDOM ACCESS MEMORY DEVICE

[75] Inventors: Ih-Chin Chen, Richardson; Hisashi Shichijo; Clarence W. Teng, both of Plano, all of Tex.

[73] Assignee: Texas Instruments Incorporated, Dallas, Tex.

[21] Appl. No.: 08/909,904

[22] Filed: Aug. 12, 1997

Related U.S. Application Data

[63] Continuation of application No. 08/797,227, Feb. 7, 1997, abandoned, which is a continuation of application No. 08/650,933, May 17, 1996, abandoned, which is a continuation of application No. 08/474,855, Jun. 7, 1995, abandoned, which is a division of application No. 08/236,745, Apr. 29, 1994, Pat. No. 5,595,925.

[51] Int. Cl.$^6$ .................................... H01L 27/108
[52] U.S. Cl. ...................... 257/296; 257/301; 257/369
[58] Field of Search ............................ 257/296, 299, 257/301, 901, 369

[56] References Cited

U.S. PATENT DOCUMENTS

| 3,916,430 | 10/1975 | Heuner et al. | 357/42 |
|---|---|---|---|
| 5,251,172 | 10/1993 | Yamauchi | 365/189.09 |
| 5,260,226 | 11/1993 | Sawada et al. | 437/29 |
| 5,281,842 | 1/1994 | Yasuda et al. | 257/371 |
| 5,293,055 | 3/1994 | Hara et al. | 257/296 |
| 5,324,982 | 6/1994 | Nakazato et al. | 257/546 |
| 5,348,905 | 9/1994 | Kenney | 437/52 |
| 5,373,476 | 12/1994 | Jeon | 257/296 |
| 5,512,767 | 4/1996 | Noble, Jr. | 257/301 |
| 5,585,659 | 12/1996 | Kobayashi et al. | 257/371 |

FOREIGN PATENT DOCUMENTS

| 0 245 515 A1 | 11/1986 | European Pat. Off. | H01L 27/06 |
|---|---|---|---|
| 0 298 421 A2 | 5/1988 | European Pat. Off. | H01L 27/10 |
| 0 550 894 A1 | 12/1992 | European Pat. Off. | H01L 27/108 |
| 2 199 695 | 12/1987 | United Kingdom | H01L 27/10 |
| 2 269 049 | 3/1993 | United Kingdom | H01L 27/108 |

OTHER PUBLICATIONS

S. Yoshikawa, et al., *Process Technologies for A High Speed 16MDRAM With Trench Type Cell*, Semiconductor Device Engineering Laboratory, Toshiba Corp., pp. 67–68. (date unknown).

Syuso Fujii, et al., *A 45ns 16Mb DRAM with Triple–Well Structure*, 1989 IEEE International Solid–State Circuits Conference, pp. 248–249, Feb. 1989.

*Primary Examiner*—Mark V. Prenty
*Attorney, Agent, or Firm*—David Denker; Jacqueline J. Garner; Richard L. Donaldson

[57] ABSTRACT

A dynamic random access memory device (10) includes three separate sections—an input/output section (12), a peripheral transistor section (14), and a memory array section (16), all formed on a p– type substrate layer (18). The dynamic random access memory device (10) can employ separate substrate bias voltages for each section. The input/output section (12) has a p– type region (22) that is isolated from the p– type substrate layer (18) by an n– type well region (20). The peripheral transistor section (14) has a p– type region (36) that can be isolated from the p– type substrate layer (18) by an optional n– type well region (40) for those devices which require a different substrate bias voltage between the peripheral transistor section (14) and the memory array section (16).

23 Claims, 1 Drawing Sheet

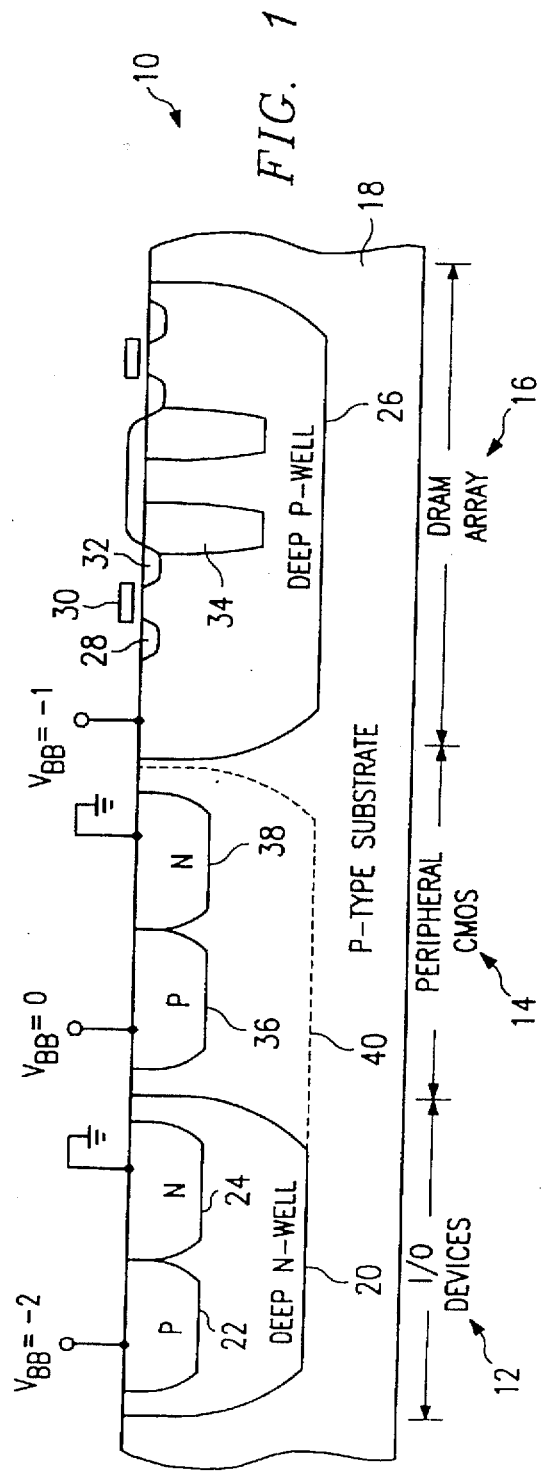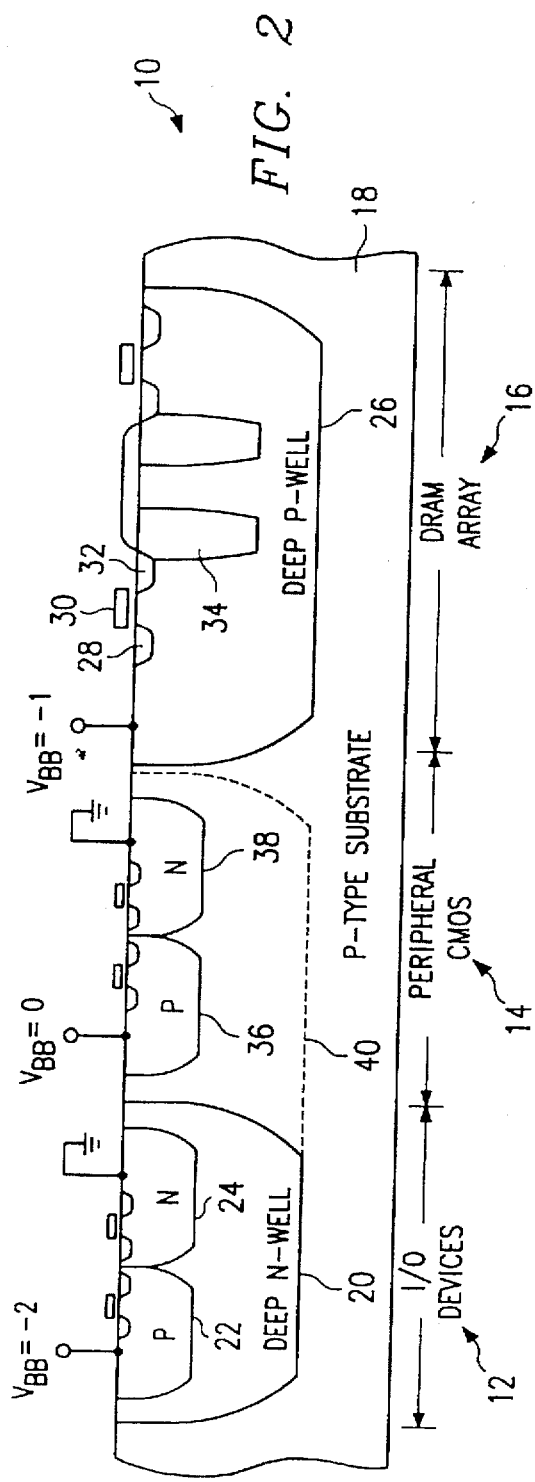

MULTIPLE SUBSTRATE BIAS RANDOM ACCESS MEMORY DEVICE

This application is a continuation of application Ser. No. 08/797,227 filed on Feb. 7, 1997, now abandoned; which is a continuation of Ser. No. 08/650,933 filed on May 17, 1996, now abandoned; which is a continuation of Ser. No. 08/474,855 filed on Jun. 7, 1995, now abandoned; which is a divisional of Ser. No. 08/236,745 filed on Apr. 29, 1994, now issued as U.S. Pat. No. 5,595,925.

TECHNICAL FIELD OF THE INVENTION

The present invention relates in general to semiconductor fabrication processes and devices and more particularly to an apparatus and method of fabricating a multiple substrate bias dynamic random access memory device.

BACKGROUND OF THE INVENTION

Dynamic random access memory (DRAM) devices have traditionally employed a substrate bias voltage on the N-channel transistors to improve latch up immunity, cell isolation, and circuit speed. However, for submicron devices, the substrate bias enhances an undesirable short channel effect. This short channel effect produces a large threshold voltage difference between devices of different sizes when the substrate bias voltage is applied. Such a large difference between devices of different sizes make the control of the threshold voltage very difficult.

Attempts to overcome this short channel effect problem include using triple well isolation to allow for different substrate biases to be applied to different parts of the dynamic random access memory. However, the triple well approach uses an unconventional n– type substrate and isolation with various p– type wells. Further, the depth of the p– type wells limit the depth for a trench in the memory array of the DRAM device. Since the trench wall is doped with an N+ conductivity type, any contact of the trench with the n– type substrate will short the trenches together. Therefore, it is desirable to overcome the short channel effect and trench depth problems through a more conventional process.

SUMMARY OF THE INVENTION

From the foregoing, it may be appreciated that a need has arisen for a dynamic random access memory device that operates on multiple substrate bias voltages in order to overcome the short channel effect. A need has also arisen for a dynamic random access memory device that overcomes the short channel effect through conventional processes.

In accordance with the present invention, an apparatus and method of fabricating a multiple substrate bias dynamic random access memory device are provided which substantially eliminate or reduce disadvantages and problems associated with other processes attempting to overcome the short channel effect.

According to an embodiment of the present invention, there is provided a method of fabricating a multiple substrate bias dynamic random access memory device that includes forming an input/output section within a p– type substrate layer where the input/output section operates from a first substrate bias voltage. A peripheral transistor section is formed within the p– type substrate layer such that the peripheral transistor section can operate from a second substrate bias voltage. A memory array section is formed within the p– type substrate layer such that the memory array section can operate from a third substrate bias voltage.

The apparatus and method of the present invention provides various technical advantages over other processes attempting to overcome the short channel effect. For example, one technical advantage is in employing a conventional p– type substrate layer to overcome the short channel effect. Another technical advantage is in overcoming the short channel effect through multiple substrate bias voltage implementation. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 1 illustrates a multiple substrate bias dynamic random access memory device.

FIG. 2 illustrates a multiple substrate bias dynamic random access memory device.

DETAILED DESCRIPTION OF THE INVENTION

FIG. 1 shows a dynamic random access memory device 10 which, can employ multiple substrate bias voltages. Dynamic random access memory device 10 is made up of at least three distinct sections—an input/output section 12, a peripheral transistor section 14, and a memory array section 16. Each section of dynamic random access memory device 10 can be individually isolated on a p– type substrate layer 18.

Input/output section 12 is made by forming an n– type well region 20 within p– type substrate layer 18. A p– type region 22 and an n– type region 24 are formed within n– type well region 20. n– type well region 20 isolates p– type region 22 from p– type substrate layer 18.

Memory array section 16 is made by forming a p– type well region 26 within p– type substrate layer 18. Multiple subdevices having a source region 28, a gate region 30, and a drain region 32 are formed within p– type well region 26. The multiple subdevices of memory array section 16 are isolated by trenches 34.

Peripheral transistor section 14 is made by forming a p– type region 36 and an n– type region 38 within p– type substrate layer 18. If isolation is required between peripheral transistor section 14 and memory array section 16, an optional n– type well region 40 can be formed prior to forming p– type region 36 and n– type region 38 in order to isolate p– type region 36 from p– type substrate layer 18.

With the formation of n– type well region 40, dynamic random access memory device 10 can, but is not required to, operate with three separate substrate bias voltages. In the peripheral transistor section 14, a neutral substrate bias voltage of ground is applied to avoid any back gate biasing of transistors and suppress the short channel effects that result in a larger body effect on the threshold voltage. A different bias voltage may be applied to memory array section 16 in order to improve cell isolation and reduce junction capacitance. Since inter p– type well isolation is achieved by the n– type well region, which can be driven at the same time as the p– type well region 26 of memory array section 16, the need for an n– type substrate for well to well isolation is eliminated. Further, the trench step of trench 34 may be equal to or slightly deeper than p– type well region 26 without significantly increasing cell leakage in order that more capacitor area can be used.

In summary, a dynamic random access memory device can overcome the short channel effect by employing multiple substrate bias voltages through a conventional p– type substrate layer. Each section of the dynamic random access memory device can be individually isolated and trench depth within the memory array section is no longer a critical factor.

Thus, it is apparent that there has been provided in accordance with the present invention, an apparatus and method of fabricating a multiple substrate bias voltage dynamic random access memory device that satisfies the advantages set forth above. Although the preferred embodiment has been described in detail, it should be understood that various changes, substitutions, and alterations can be made herein. For example, process step sequence may be arranged in other ways to achieve the same dynamic random access memory device. Other examples are readily ascertainable by one skilled in the art and could be made without departing from the spirit and scope of the present invention as defined by the following claims.

What is claimed is:

1. A multiple substrate bias random access memory device comprising:

an input/output section formed on a p– type substrate layer, said input/output section operating from a first substrate bias voltage;

a peripheral transistor section formed on said p– type substrate layer, said peripheral transistor section operating from a second substrate bias voltage;

a memory array section formed on said p– type substrate layer; said memory array section operating from a third substrate bias voltage, said memory array section includes memory cells formed in a p– type well region within said p-type substrate layer, said memory cells comprising trench capacitors, said input/output section and said peripheral transistor section and said memory array section being isolated from each other;

wherein said peripheral transistor section is isolated from said p– type substrate layer by an n– type well region such that said second substrate bias voltage can have a different value than said third substrate bias voltage.

2. A multiple substrate bias random access memory device comprising:

an input/output section formed on a p– type substrate layer, said input/output section operating from a first substrate bias voltage;

a peripheral transistor section formed on said p– type substrate layer, said peripheral transistor section operating from a second substrate bias voltage;

a memory array section formed on said p– type substrate layer, said memory array section operating from a third substrate bias voltage, said memory cells comprising trench capacitors, said input/output section and said peripheral transistor section and said memory array section being isolated from each other;

wherein said peripheral transistor section is isolated from said p– type substrate layer by an n– type well region such that said second substrate bias voltage can have a different value than said third substrate bias voltage;

wherein said second substrate bias voltage is equivalent to said third substrate bias voltage.

3. The memory device of claim 1, wherein said trench capacitors extend past said p-type well region into said p-type substrate layer.

4. A multiple substrate bias random access memory device comprising, in combination:

a substrate of a first conductivity type;

a first deep well of a second conductivity type within said substrate;

a first shallow well of the first conductivity type and a first shallow well of the second conductivity type formed in said first deep well;

a second shallow well of the first conductivity type and a second shallow well of the second conductivity type formed in said substrate;

a transistor having a source and a drain, said source and drain disposed in said second shallow well of the second conductivity type;

a second deep well of the first conductivity type formed in said substrate;

a random access memory cell formed in said second deep well; and trench capacitors disposed at least partially in said second deep well.

5. The memory device of claim 4 wherein said first conductivity type is p-type and said second conductivity type is n-type.

6. The memory device of claim 4 additionally including:

a plurality of random access memory cells formed in said second deep well; and a plurality of trench capacitors disposed in said second deep well.

7. The memory device of claim 4 additionally including:

first substrate bias contact formed to contact said first shallow well of a first conductivity type second substrate bias contact formed to contact said second shallow well of a first conductivity type; and third substrate bias contact formed to contact said second deep well of a first conductivity type.

8. The memory device of claim 7 wherein said first conductivity type is p-type and said second conductivity type is n-type.

9. The memory device of claim 7 additionally including:

a plurality of random access memory cells formed in said second deep well; and a plurality of trench capacitors disposed in said second deep well.

10. A multiple substrate bias random access memory device, comprising:

a p-type substrate;

a first well structure in said p-type substrate in which input/output devices are formed, the first well structure having a deep n-type well with a shallow p-type well and a shallow n-type well with different doping than said deep n-type well formed therein, said shallow p-type well of said first well structure being operable from a first substrate bias voltage;

a second well structure in said p-type substrate, the second well structure having a shallow p-type well with different doping than said substrate and a shallow n-type well formed in the substrate, a first peripheral transistor having a source and a drain said source and drain, disposed in the shallow n-type well of said second well structure, said shallow p-type well of said second well structure being operable from a second substrate bias voltage; and a third well structure in said p-type substrate in which a memory array cell comprising a transistor is formed, said third well structure including a p-type well, with different doping than said substrate, formed in said substrate, the p-type well of said third well structure being operable from the second substrate bias voltage.

11. The memory device of claim 10, wherein said memory array cell further comprises a trench capacitor.

12. The memory device of claim 11, wherein said trench capacitor extends past said p-type well of said third well structure into said p-type substrate.

13. The memory device of claim 10, further comprising a first-well-structure transistor having a source and a drain, said source and drain disposed in the shallow n-type well of said first well structure.

14. The memory device of claim 10, further comprising a first-well-structure transistor having a source and a drain, said source and drain disposed in the shallow p-type well of said first well structure.

15. The memory device of claim 10, further comprising a second-well-structure transistor having a source and a drain, said source and drain disposed in the shallow p-type well of said second well structure.

16. The memory device of claim 10, wherein said first and second substrate bias voltages are different.

17. A multiple well structure for a random access memory device, comprising, in combination:

a substrate of a first conductivity type;

a first deep well region of a second conductivity type formed in said substrate of a first conductivity type;

a first intermediate well region of the first conductivity type and a second intermediate well region of the second conductivity type disposed within said first deep well region comprising the region in which input/output devices are formed, said first intermediate well region of the input/output section being operable from a first substrate bias voltage and said second intermediate well region having different doping than said first deep well region;

a third intermediate well region of the first conductivity type and a fourth intermediate well region of the second conductivity type disposed in said substrate comprising the region in which peripheral transistors are formed, said third intermediate well region of the peripheral transistor section being operable from a second substrate bias voltage different from said first substrate bias voltage;

source and drain regions of a peripheral transistor disposed in said fourth intermediate well region;

a second well region of the first conductivity type disposed within said substrate; and a plurality of memory cells disposed within said second well region to form a memory array section for the device, the memory array section operating from the second substrate bias voltage.

18. The multiple well structure of claim 17, wherein said first and second substrate bias voltages are different.

19. A multiple well structure in which transistors for a random access memory can be formed, the structure comprising, in combination;

a p-type substrate;

a first well structure disposed in said p-type substrate in which an input/output section is formed, said first well structure having a deep n-type well with a shallow p-type well and a shallow n-type well formed therein, said shallow p-type well of said first well structure being operable from a first substrate bias voltage and said shallow n-type well having a different doping from said deep n-type well;

a transistor having a source and a drain, said source and drain disposed in said shallow n-type well of said first well structure;

a second well structure in said p-type substrate in which peripheral transistors are formed, said second well structure having a deep n-type well, with a shallow p-type well and a shallow n-type well formed in the deep n-type well, said shallow p-type well of said second well structure operating from a second substrate bias voltage different from said first substrate bias voltage and said shallow n-type well formed in the deep n-type well of said second well structure having a different doping from the doping of said deep n-type well of said second well structure;

a third well structure in said p-type substrate in which at least one memory cell of a memory array is disposed, said third well structure having a p-type well formed in said substrate and having different doping from said substrate, said p-type well of said third well structure operating from a third substrate bias voltage; and said memory cell comprising a transistor.

20. The multiple well structure of claim 19, wherein said first, second, and third substrate bias voltages are all different.

21. A multiple substrate bias random access memory device, comprising:

a first conductivity type substrate;

a first well structure in said first conductivity type substrate having a deep second conductivity type well with a first shallow first conductivity type well and a first shallow second conductivity type well with different doping than said deep second conductivity type well disposed therein, said first shallow first conductivity type well being operable from a first substrate bias voltage;

said deep second conductivity type well also having a second shallow first conductivity type well and a second shallow second conductivity type well with different doping than said deep second conductivity type well disposed therein, said second shallow first conductivity type well being operable from a second substrate bias voltage, and a first peripheral transistor having a source and a drain, said source and drain disposed in the second shallow second conductivity type well;

a second well structure in said first conductivity type substrate in which a memory array cell comprising a transistor is disposed, said third well structure including a first conductivity type well, with different doping than said substrate, disposed in said substrate, the first conductivity type well of said third well structure being operable from a third substrate bias voltage.

22. The memory device of claim 21, wherein said first conductivity type is p-type and said second conductivity type is n-type.

23. The memory device of claim 21, wherein said first, second, and third substrate bias voltages are all different.

* * * * *